(12) United States Patent
Filla et al.

(10) Patent No.: US 6,424,536 B1
(45) Date of Patent: Jul. 23, 2002

(54) CIRCUIT BOARD PROTECTION METHOD AND APPARATUS

(75) Inventors: Martin Filla; Lawrence L. D'Anna, both of Watauga, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/627,999

(22) Filed: Jul. 28, 2000

(51) Int. Cl.⁷ .................................................. H05K 7/14
(52) U.S. Cl. ........................ 361/752; 361/749; 361/814
(58) Field of Search ............................... 361/683–686, 361/728, 740, 741, 747, 756, 759, 801, 802, 736, 742, 758, 787, 769, 770, 797, 804, 752, 754, 753, 784, 796; 455/90, 347, 575; 379/428, 429; 439/76.1

(56) References Cited

U.S. PATENT DOCUMENTS

| | | | | |
|---|---|---|---|---|
| 5,091,826 A | * | 2/1992 | Arnett et al. ............... | 439/76.1 |
| 5,521,794 A | * | 5/1996 | Hargrave et al. ........... | 455/347 |
| 5,866,862 A | * | 2/1999 | Riffil et al. ................. | 200/5 R |
| 6,088,232 A | * | 7/2000 | Ho .............................. | 361/754 |

* cited by examiner

Primary Examiner—David L. Talbott
Assistant Examiner—John B. Vigushin
(74) Attorney, Agent, or Firm—Wayne DeMello; Brian Rivers

(57) ABSTRACT

Method and apparatus for affixing a circuit board with a protective chassis by affixing the circuit board substantially near the center of the long axis of the circuit board so that ends of the circuit board along the longer axis of the circuit board can flex freely uninhibited by the chassis. In the event that the circuit board-chassis unit is hit or dropped, since the mechanical shock is transmitted from the impact point on the chassis only to the approximate center of the circuit board, circuit components on the circuit board located away from the center of the circuit board will experience a reduced level of mechanical shock. Also, solder joints will experience less mechanical stress because there is less circuit board bending. This reduction in the level of mechanical shock to the circuit board increases the chances that the circuit components will not be damaged or become detached from the circuit board.

10 Claims, 2 Drawing Sheets

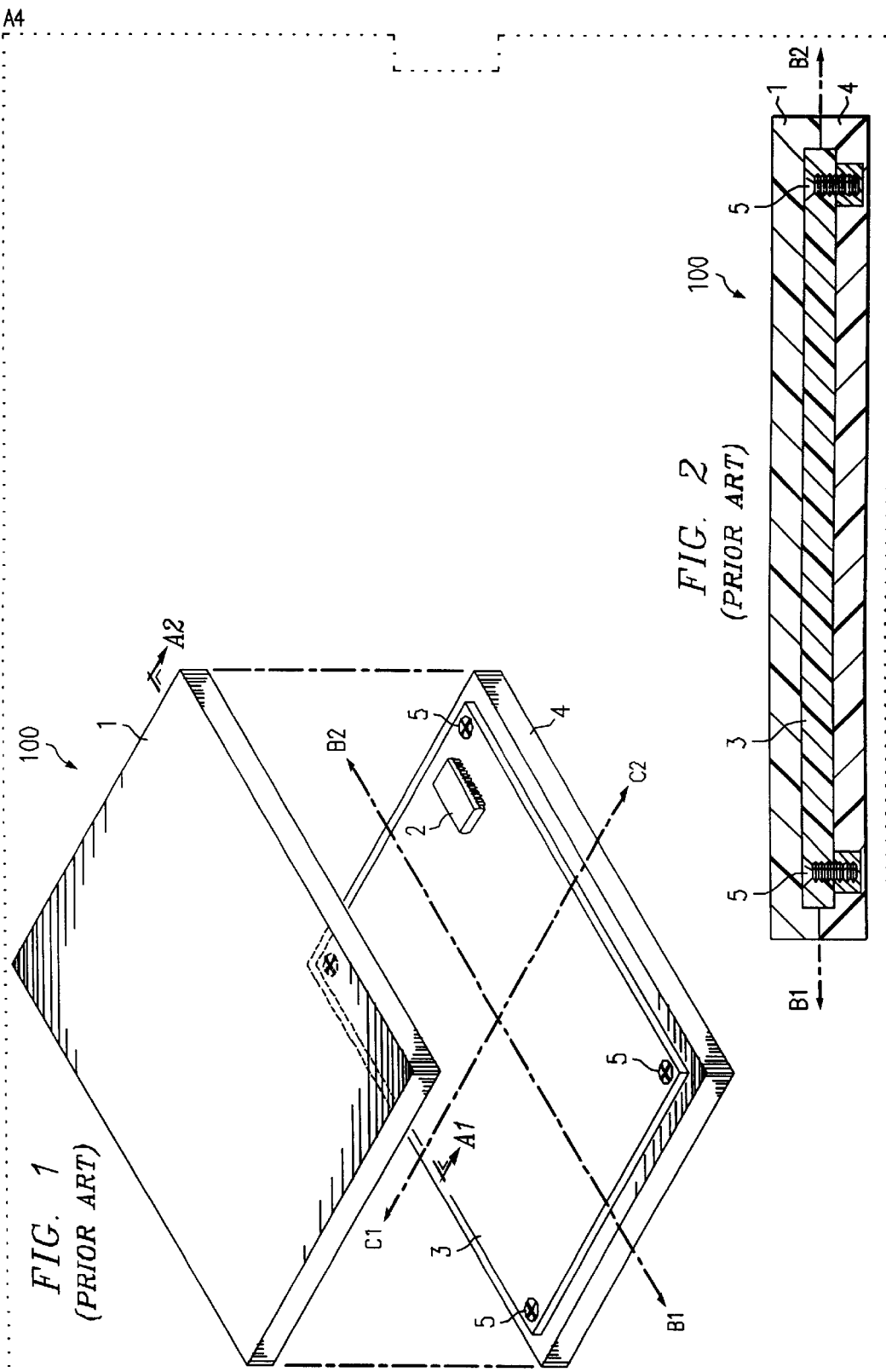

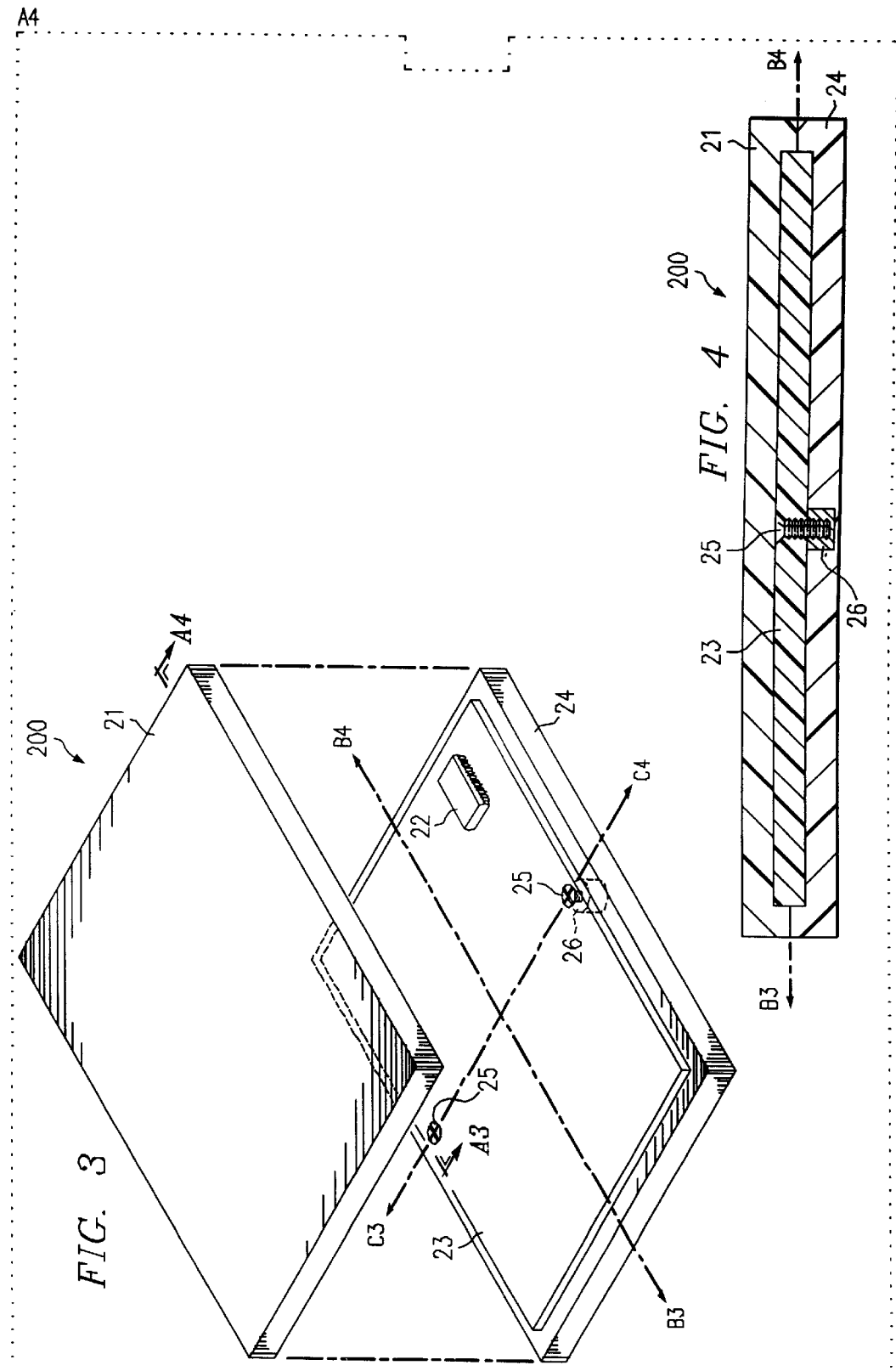

CIRCUIT BOARD PROTECTION METHOD AND APPARATUS

BACKGROUND

During the past decade portable consumer electronic devices such as radios, mobile phones and pagers have become enormously popular with the general public. The small size and shape of these devices makes portability easy and very practical. However, because consumers carry these devices in a pocket or wear them on their clothing, the chances of the device being inadvertently hit, or dropped on the floor and damaged, is very high.

New circuit component packages such as ball grid array (BGA) components which are commonly found in portable electronic devices have proven to be much less tolerant to mechanical shock than the traditional Quad Flat Pack (QFP) technology. Most BGA packages have no stress relief built into their interposer that electrically and mechanically connects the Silicon die to the circuit board. When the circuit board is under tension or compression such as during mechanical shock, the result frequently is solder joint failure between the BGA package and the circuit board. Under mechanical shock such as when the circuit board and protective chassis are dropped or hit, the mechanics of the shock to the protective chassis transfer a great deal of stress to the PCB and thus to the circuit components physically located near the point of impact. It is the transfer of mechanical shock to the PCB that is primarily responsible for the BGA failure. This has forced some PCB manufacturers to undergo the expensive and time-consuming process of under-filling the BGA with a protective insulating material to reduce the amount of stress transferred to the BGA and minimize this inevitable mechanical shock.

Information relevant to attempts to address these problems can be found in portable electronic device manufacturing facilities around the world. However, the existing art suffers from lack of protection given to the circuit board and electronic components contained within the portable electronic device.

Referring to prior art FIG. 1, a portable electronic device 100 generally comprises a top chassis cover 1 and a bottom chassis cover 4 housing a circuit board 3 which is affixed to said bottom chassis cover at affixing points 5. Prior art FIG. 2. illustrates a cross-sectional view of the portable electronic device 100, taken along line A1—A2 comprising top chassis cover 1 and bottom chassis cover 4 housing a circuit board 3.

Although prior art FIG. 1 and FIG. 2 illustrate that circuit board 3 is affixed to bottom chassis cover 4, generally prior art includes circuit board 3 affixed to one of either top or bottom chassis cover or both chassis covers.

When a circuit board is affixed to the protective chassis on all ends with a screw or other affixing mechanism as illustrated in FIG. 1 and FIG. 2, the circuit board will bend with the mechanics, thus making the solder joints for micro BGA devices and other devices which are sensitive to mechanical stress susceptible to solder joint fracture. The closer a particular circuit component is to the protective chassis and circuit board affixing point, the greater the circuit component will be affected by the mechanical shock of the impact to that area on the protective chassis.

For the foregoing reasons, there is a need to protect the circuit board enclosed within a protective chassis from mechanical shock sustained from, for example, an impact with the ground or floor if a portable electronic device is dropped.

SUMMARY OF THE INVENTION

The invention provides a solution to the problem of damaged circuit components on a circuit board resulting from mechanical shock such as when a portable electronic device is hit or dropped. According to the invention, the circuit board is affixed substantially near the center of the long axis of the circuit board so that the ends of the circuit board along the longer axis can flex freely uninhibited by the chassis. In this case, according to the invention, since the circuit board is not rigidly attached to the chassis more of the mechanical shock will be absorbed by the chassis and not transferred to the circuit board. Using this method of affixing the circuit board to the protective chassis allows the mechanical shock to be transferred from the protective chassis to the approximate center of the circuit board where the circuit board is affixed to the protective chassis. Since the mechanical shock is transmitted substantially near the center of the circuit board, circuit components on the circuit board located away from the center of the circuit board will experience a reduced level of mechanical shock. This reduction in the level of mechanical shock increases the chances that the circuit components will not be damaged or become detached from the circuit board.

BRIEF DESCRIPTION OF THE DRAWINGS

FIG. 1 is an exploded view illustrating a portable electronic device in accordance with existing prior art.

FIG. 2 is a cross-sectional view illustrating a portable electronic device in accordance with existing prior art.

FIG. 3 is an exploded view illustrating a portable electronic device in accordance with an embodiment of the invention.

FIG. 4 is a cross-sectional view illustrating a portable electronic device in accordance with an embodiment of the invention.

DESCRIPTION

FIGS. 3 and 4 illustrate a portable electronic device 200 which includes a circuit board 23 affixed to a bottom chassis cover 24 substantially near the center, along line C3–C4, of the long axis along line B3–B4 of the circuit board so that ends of the circuit board along the longer axis can flex freely uninhibited by the chassis. Although FIGS. 3 and 4 illustrate circuit board 23 affixed with bottom chassis cover 24 substantially near the center, along lines C3–C4, of the longer axis along lines B3–B4 of circuit board 23, according to an embodiment of the invention, in alternative embodiments, the circuit board may be affixed to one of either the bottom chassis cover, the top chassis cover or both chassis covers substantially near the center of the longer axis of the circuit board. Although FIGS. 3 and 4 illustrate a screw 25 and internally threaded boss 26 as a fastener, the invention includes all other techniques and mechanisms for affixing the circuit board to the chassis. Although FIGS. 3 and 4 illustrate a rectangular shaped chassis, according to alternative embodiments the chassis may be any shape. Although FIGS. 3 and 4 illustrate a rectangular shaped circuit board, according to alternative embodiment the circuit board may be any shape.

By affixing the circuit board to the cover only near the center of the long axis of the circuit board so that ends of the circuit board along the long axis can flex freely uninhibited by the chassis, mechanical shock experienced by circuit components is significantly reduced in the event the unit is hit or dropped.

From the foregoing description, it will be evident that there are a number of changes, adaptations and modifications of the present invention which come within the province of those skilled in the art. However, it is intended that all such variations not departing from the spirit of the invention be considered as within the scope thereof as limited solely by the claims appended thereto.

What is claimed is:

1. A method of affixing circuit board to a protective chassis using an affixing mechanism said circuit board having a long axis and at least one end along said long access, said method comprising steps of:

a. Affixing said circuit board with said protective chassis substantially near-the center of said long axis of the circuit board wherein at least one end of the circuit board along said long axis can flex freely uninhibited by said protective chassis.

2. A method as in claim 1 wherein said affixing mechanism comprises a screw.

3. A method as in claim 1 wherein said circuit board is rectangular.

4. An apparatus comprising:

a) a protective chassis, and b) an affixing mechanism, and c) a circuit board having a long axis and at least one end along said long axis, said circuit board affixed with said protective chassis substantially near the center of said long axis of said circuit board using said affixing mechanism wherein at least one end of the circuit board along said long access can flex freely uninhibited by said protective chassis.

5. An apparatus as in claim 4, wherein said circuit board is rectangular-shaped and has a pair of long edges, and wherein said affixing mechanism further comprises a pair of screws, each for affixing said circuit board to said protective chassis substantially near the center of one of said pair of long edges of said circuit board.

6. An apparatus as in claim 4 wherein said circuit board contains electrical, mechanical and electro-mechanical components.

7. An apparatus as in claim 4 wherein said apparatus is a mobile phone.

8. An apparatus as in claim 4, wherein said circuit board comprises a pair of ends opposite one another along said long axis, wherein each of said pair of ends opposite one another along said long axis can flex freely uninhibited by said protective chassis.

9. A method of affixing a circuit board to a protective chassis using an affixing mechanism, said circuit board having a long axis and at least one end intersecting with said long access, said method comprising steps of:

a) affixing said circuit board with said protective chassis substantially near the center of said long access of the circuit board wherein at least one end of the circuit board intersecting with said long axis can flex freely uninhibited by said protective chassis.

10. An apparatus comprising:

a) a protective chassis, and b) an affixing mechanism, and c) a circuit board having a long axis and at least one end intersecting with said long axis, said circuit board affixed with said protective chassis substantially near the center of said long axis of said circuit board using said affixing mechanism wherein at least one end of the circuit board intersecting with said long access can flex freely uninhibited by said protective chassis.

* * * * *